United States Patent
Na et al.

(10) Patent No.: US 10,297,622 B2
(45) Date of Patent: May 21, 2019

(54) ORGANIC LIGHT-EMITTING DISPLAY DEVICE COMPRISING MULTIPLE TYPES OF THIN-FILM TRANSISTORS AND METHOD OF FABRICATING THE SAME

(71) Applicant: LG DISPLAY CO., LTD., Seoul (KR)

(72) Inventors: HyungIl Na, Seoul (KR); JungJune Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/675,220

(22) Filed: Aug. 11, 2017

(65) Prior Publication Data

US 2018/0061868 A1     Mar. 1, 2018

(30) Foreign Application Priority Data

Aug. 31, 2016 (KR) .................. 10-2016-0111712

(51) Int. Cl.
| | |
|---|---|
| *H01L 27/12* | (2006.01) |
| *H01L 27/32* | (2006.01) |
| *H01L 29/49* | (2006.01) |
| *H01L 29/423* | (2006.01) |
| *H01L 29/786* | (2006.01) |

(52) U.S. Cl.
CPC ...... *H01L 27/1251* (2013.01); *H01L 27/3244* (2013.01); *H01L 29/42384* (2013.01); *H01L 29/4908* (2013.01); *H01L 29/7869* (2013.01); *H01L 29/78672* (2013.01)

(58) Field of Classification Search
CPC ............ H01L 27/3262; H01L 27/1251; H01L 29/7869; H01L 2251/5338; H01L 2227/323

See application file for complete search history.

(56) References Cited

U.S. PATENT DOCUMENTS

| | | | |
|---|---|---|---|
| 2012/0025320 A1* | 2/2012 | Chen .................. | H01L 27/1225 257/369 |
| 2017/0084642 A1* | 3/2017 | Lin ..................... | H01L 27/1251 |
| 2017/0162606 A1* | 6/2017 | Yan .................... | H01L 27/1251 |
| 2018/0095584 A1* | 4/2018 | Lee ....................... | G06F 3/0416 |
| 2018/0122298 A1* | 5/2018 | Lee ........................ | G09G 3/3233 |
| 2018/0122323 A1* | 5/2018 | Park ....................... | G09G 3/3677 |
| 2018/0145094 A1* | 5/2018 | Yan ................... | H01L 29/78696 |

* cited by examiner

Primary Examiner — Zandra V Smith
Assistant Examiner — John M Parker
(74) Attorney, Agent, or Firm — Birch, Stewart, Kolasch & Birch, LLP

(57) ABSTRACT

An OLED device includes a low-temperature poly-silicon (LTPS) thin-film transistor having a first channel layer, a first gate electrode, a first source electrode and a first drain electrode; an oxide semiconductor thin-film transistor having a second channel layer, a second gate electrode, a second source electrode and a second drain electrode; and a functional layer between the first channel layer and the first gate electrode. The second channel layer is in contact with an upper surface of the functional layer.

9 Claims, 12 Drawing Sheets

ORGANIC LIGHT-EMITTING DISPLAY DEVICE COMPRISING MULTIPLE TYPES OF THIN-FILM TRANSISTORS AND METHOD OF FABRICATING THE SAME

CROSS-REFERENCE TO RELATED APPLICATIONS

This application claims the priority of Korean Patent Application No. 10-2016-0111712 filed on Aug. 31, 2016, in the Korean Intellectual Property Office, the disclosure of which is incorporated herein by reference.

BACKGROUND

Technical Field

The present disclosure relates to an organic light-emitting display (OLED) device including multiple types of thin-film transistors and a method of fabricating such an OLED device. More specifically, the present disclosure relates to an OLED device in which different types of thin-film transistors are disposed on a single substrate, and a method of fabricating such an OLED device.

Description of the Related Art

As the era of information technology has truly begun, the field of display that represents electrical information signals graphically has been rapidly developing. In accordance with this, various types of display devices which are thinner, lighter and consume less power have been developed to replace existing CRTs (cathode ray tubes).

Examples of such display devices include a liquid-crystal display (LCD) device, an organic light-emitting display (OLED) device, an electrophoretic display (EPD) device and electro-wetting display (EWD) device. Among these, an OLED device has emerged as the next generation display device having a self-emitting characteristic since it exhibits good performance over LCD devices in terms of viewing angle, contrast ratio, response time, power consumption, etc.

An OLED device includes a display area in which an organic light-emitting element for displaying an image and a pixel circuit for driving the organic light-emitting element are disposed, and a non-display area adjacent to the display area, in which a driving circuit is disposed. In particular, a plurality of thin-film transistors are disposed in the pixel circuit, and the driving circuit is provided to drive the organic light-emitting element in each of the plurality of pixels.

The thin-film transistors may be classified by the material of the active layer. Among them, low-temperature poly-silicon (LTPS) thin-film transistors and oxide semiconductor thin-film transistors are most broadly used. Recently, an OLED device in which an LTPS thin-film transistor and an oxide semiconductor thin-film transistor are formed together on the same substrate is being developed.

SUMMARY

An oxide semiconductor thin-film transistor is implemented as an n-type MOSFET (hereinafter referred to as NMOS), and typically has a BCE (Back Channel Etch) structure. The BCE transistor may have a bottom gate structure, which has a drawback in that the active layer may be damaged during the dry etching process for forming the source electrode and the drain electrode. On the other hand, according to the coplanar transistor structure, the source electrode and the drain electrode are connected to the active layer through the contact holes in the insulating layer disposed on the active layer. In addition, in the coplanar transistor, since the active layer is not damaged when the source electrode and the drain electrode are formed, the coplanar transistor has better reliability than the BCE type transistor.

In order to address the reliability issue of the BCE structure, a multi-type OLED device may employ a coplanar oxide semiconductor thin-film transistor. However, the fabricating process of forming the LTPS thin-film transistor and then forming the oxide semiconductor thin-film transistor on the same substrate is very complicated. Accordingly, the present inventors recognized the need to simplify the transistor structures and the manufacturing process steps thereof.

In view of the above, the present disclosure provides an OLED device capable of addressing or solving the above-described problems.

Specifically, the present disclosure provides a multi-type OLED device capable of reducing the number of processing masks, simplifying the processing steps and reducing the number of CVD deposition steps to thereby save fabricating cost by way of simplifying the stacking structure of the LTPS thin-film transistor and the oxide semiconductor thin-film transistor. Such inventive activities resulted from the specific problem recognition by the present inventors, who developed the various concepts and details described herein.

It should be noted that the aspects of the present disclosure are not limited to the above-described and below-discussed matters, and other aspects of the present disclosure will be understood better by those skilled in the art from the following descriptions.

According to an aspect of the present disclosure, there is provided an OLED device. The OLED device includes a low-temperature poly-silicon (LTPS) thin-film transistor having a first channel layer, a first gate electrode, a first source electrode and a first drain electrode; an oxide semiconductor thin-film transistor having a second channel layer, a second gate electrode, a second source electrode and a second drain electrode; and a functional layer between the first channel layer and the first gate electrode. The second channel layer is in contact with an upper surface of the functional layer.

According to another aspect of the present disclosure, there is provided a method of fabricating an OLED device including forming a first active layer of an LTPS thin-film transistor on a substrate; forming a first gate insulating layer of the LTPS thin-film transistor on the first active layer; forming a second active layer of an oxide semiconductor thin-film transistor on the first gate insulating layer; and forming a first gate electrode of the LTPS thin-film transistor and a second gate electrode of the oxide semiconductor thin-film transistor on the first gate insulating layer and the second active layer, respectively, wherein the second active layer is adjacent to an upper surface of the first gate insulating layer.

The details of one or more embodiments of the subject matter described in this specification are set forth in the accompanying drawings and the description below.

According to an exemplary embodiment of the present disclosure, there are provided an OLED device having a novel structure capable of addressing a variety of problems arising when multiple types of thin-film transistors are formed on a single substrate, and a method of fabricating the same.

Specifically, according to an exemplary embodiment of the present disclosure, an oxide semiconductor thin-film transistor in the OLED device has a coplanar structure, such that the reliability can be improved.

In addition, according to an exemplary embodiment of the present disclosure, an oxide semiconductor thin-film transistor is disposed on the gate insulating layer of an LTPS thin-film transistor, such that the stacking structure of the OLED device can become simpler.

Further, according to an exemplary embodiment of the present disclosure, the stacking structure of the thin-film transistors become simpler, such that the fabrication processing time of the OLED device become shortened, and the number of masks and the processing cost can be advantageously reduced.

Moreover, according to an exemplary embodiment of the present disclosure, an LTPS thin-film transistor and parts of an oxide thin-film transistor can be formed at the same time, such that the processing time or the processing cost can be effectively reduced.

It should be noted that effects of the present disclosure are not limited to those described above and other effects and advantages of the present disclosure will be understood by those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
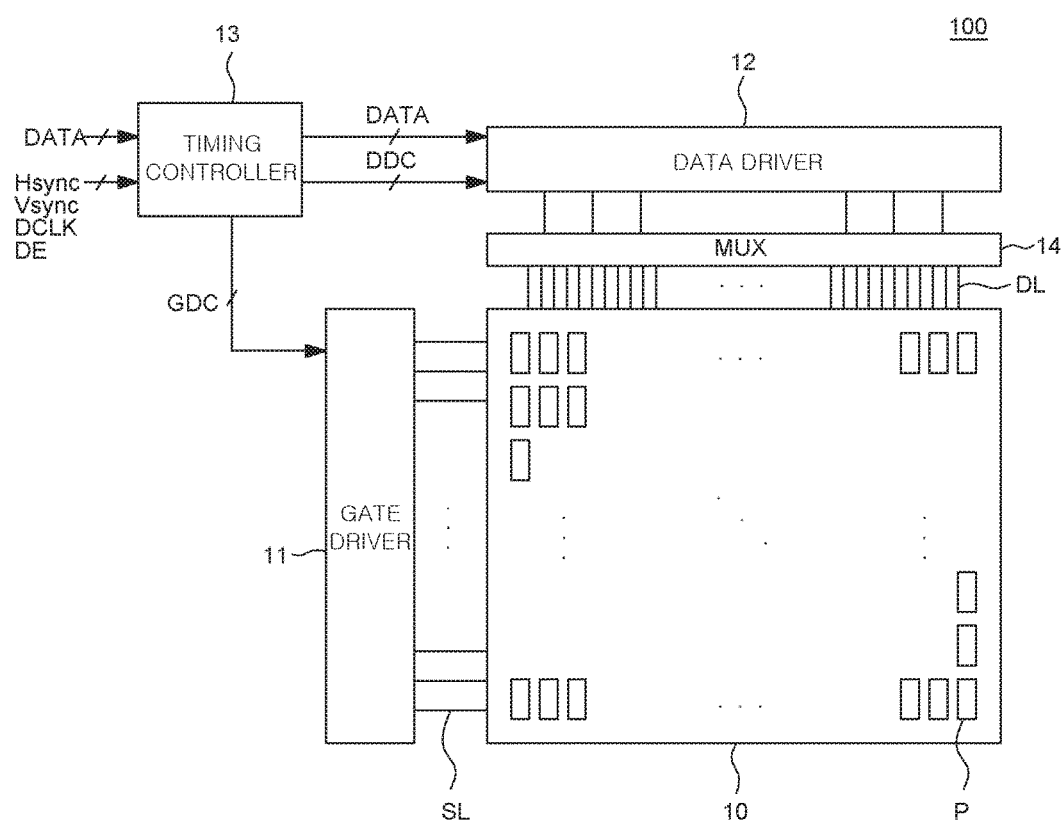
FIG. 1 is a block diagram illustrating an OLED device including multiple types of thin-film transistors according to an exemplary embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure can be defined by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C (or additional elements) may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

In an OLED device including multiple types of thin-film transistors according to an exemplary embodiment of the present disclosure, at least two types of thin-film transistors are formed on the same substrate. As used herein, the multiple types of thin-film transistors refer to different types of thin-film transistors formed on a single substrate. As at least two types of thin-film transistors, a thin-film transistor having a polysilicon material as an active layer and a thin-film transistor having a metal oxide as an active layer are used.

In the OLED device including multiple types of thin-film transistors according to an exemplary embodiment of the present disclosure, a low-temperature poly-silicon (LTPS) thin-film transistor denotes a thin-film transistor having a polysilicon material as its active layer. Since the polysilicon material has a high mobility (100 $cm^2$/Vs or higher), it has low energy consumption power and high reliability. Accordingly, the LTPS thin-film transistor may be employed in a gate driver circuit for driving thin-film transistors for display elements and/or in a multiplexer (MUX) circuit. Specifically, it may be employed as a driving thin-film transistor in a pixel in an OLED device.

In addition, in an OLED device including multiple types of thin-film transistors according to an exemplary embodiment of the present disclosure, an oxide semiconductor thin-film transistor having an oxide semiconductor material as an active layer is used. Since the oxide semiconductor material has a larger band gap than the silicon material, electrons cannot go over the band gap in the off state, and thus the off-current is low. Therefore, the oxide semiconductor thin-film transistor is suitable for a switching thin-film transistor which has a shorter on-time and a longer off-time. In addition, the oxide semiconductor thin-film transistor has a small off-current, the storage capacitance can be reduced, and thus the oxide semiconductor thin-film transistor is suitable for a high-resolution display element.

In the OLED device including multiple types of thin-film transistors according to an exemplary embodiment of the present disclosure, the LPTS thin-film transistor and the oxide semiconductor thin-film transistor having different properties are disposed on the same substrate, thereby achieving optimal performance.

FIG. 1 is a block diagram illustrating an OLED device including multiple types of thin-film transistors according to an exemplary embodiment of the present disclosure. All the components of the OLED device according to all embodiments of the present disclosure are operatively coupled and configured.

Referring to FIG. 1, an OLED device 100 includes an organic light-emitting display panel 10, a gate driver 11, a data driver 12, a multiplexer (MUX) 14, and a timing controller 13.

The timing controller 13 controls a display panel driving circuit including the data driver 12 and the gate driver 11 for applying data of an input image to pixels P of the organic light-emitting display panel 10. When the organic light-emitting display panel 10 further includes a touch sensing unit, the display panel driving circuit may further include a touch sensing driver.

On the organic light-emitting display panel 10, a plurality of data lines DL and a plurality of scan lines SL intersect one another, and a plurality of pixels P are arranged in a matrix. In addition, on the organic light-emitting display panel 10, various lines such as an initialization voltage line, an emission control signal line, a high-potential voltage line and a low-potential voltage line may be further disposed.

The plurality of pixels P each produces a color and may include a red subpixel, a green subpixel, and a blue subpixel. In addition, the plurality of pixels P may further include a white subpixel in order to improve the brightness and lifetime of the organic light-emitting display panel 10. A red subpixel, a green subpixel and a blue subpixel (and a white subpixel) may form a group to produce a desired color.

The data driver 12 converts digital data DATA of an input image received from the timing controller 13 at every frame to an analog data voltage and then provides the data voltage to the data line DL. The data driver 12 may output a data voltage using a digital-to-analog converter (DAC) that converts digital data to a gamma correction voltage.

The multiplexer 14 may be disposed between the data driver 12 and the data lines DL of the organic light-emitting display panel 10. The multiplexer 14 can reduce the number of output channels of the data driver 12 by dividing the data voltage output from the data driver 12 through a single output channel into N channels, where N is a positive integer equal to or greater two. The multiplexer 14 may be omitted depending on the resolution and application (or purpose) of the OLED device 100. The multiplexer 14 may be implemented as a switch circuit, and the switch circuit is turned on/off under the control of the timing controller 13.

The gate driver 11 outputs a scan signal and an emission control signal under the control of the timing controller 13 to select a pixel P to be charged with a data voltage through the scan lines SL and adjust the emission timing. The gate driver 11 may shift the scan signal and the emission control signal using a shift register to sequentially supply the signals to the scan lines SL. The shift register of the gate driver 11 may be formed directly on the substrate of the organic light-emitting display panel 10 by using gate-driver in panel (GIP) technology.

The timing controller 13 receives digital video data DATA of an input image and a timing signal synchronized with the digital video data DATA from a host system. The timing signal may include a vertical synchronization signal Vsync, a horizontal synchronization signal Hsync, a clock signal DCLK, and a data enable signal DE. The host system may be one of a variety of electronic devices such as a television system, a set-top box, a navigation system, a DVD player, a Blu-ray player, a personal computer (PC), a home theater system and a phone system.

The timing controller 13 may multiply the input frame frequency by i times and may control the operation timing of the gate driver 11, the data driver 12 and the like with the frequency equal to the input frame frequency×i Hz, where i is a positive integer greater than zero. The input frame frequency may be 60 Hz in the National Television Standards Committee (NTSC) system and 50 Hz in the Phase-Alternating Line (PAL) system.

The timing controller 13 may generate a data timing control signal DDC for controlling the operation timing of the data driver 12, MUX selection signals MUX_R, MUX_G, and MUX_B for controlling the operation timing of the multiplexer 14, and a gate timing control signal GDC for controlling the operation timing of the gate driver 11, based on the timing signals Vsync, Hsync, DCLK and DE received from the host system.

The data timing control signal DDC may include a source start pulse SSP, a source sampling clock SSC, a polarity control signal POL, a source output enable signal SOE, etc. The source start pulse SSP controls the sampling start timing of the data driver 12. The source sampling clock SSC is a clock for shifting the data sampling timing. The polarity control signal (POL) controls the polarity of the data signal output from the data driver 12. When a signal transfer interface between the timing controller 13 and the data driver 12 is a mini low voltage differential signaling (LVDS) interface, the source start pulse SSP and the source sampling clock SSC may be omitted.

The gate timing control signal GDC includes a gate start pulse GSP, a gate shift clock CLK, a gate output enable signal GOE, and the like. In the case of the GIP circuit, the gate output enable signal GOE may be omitted. The gate start pulse GSP is generated once at the beginning of every frame period and input to the shift register. The gate start pulse GSP controls the start timing at which the gate pulse of the first block is output at every frame period. The clock CLK is input to the shift register to control the shift timing of the shift resister. The gate output enable signal GOE defines the output timing of the gate pulse.

Figure 2:
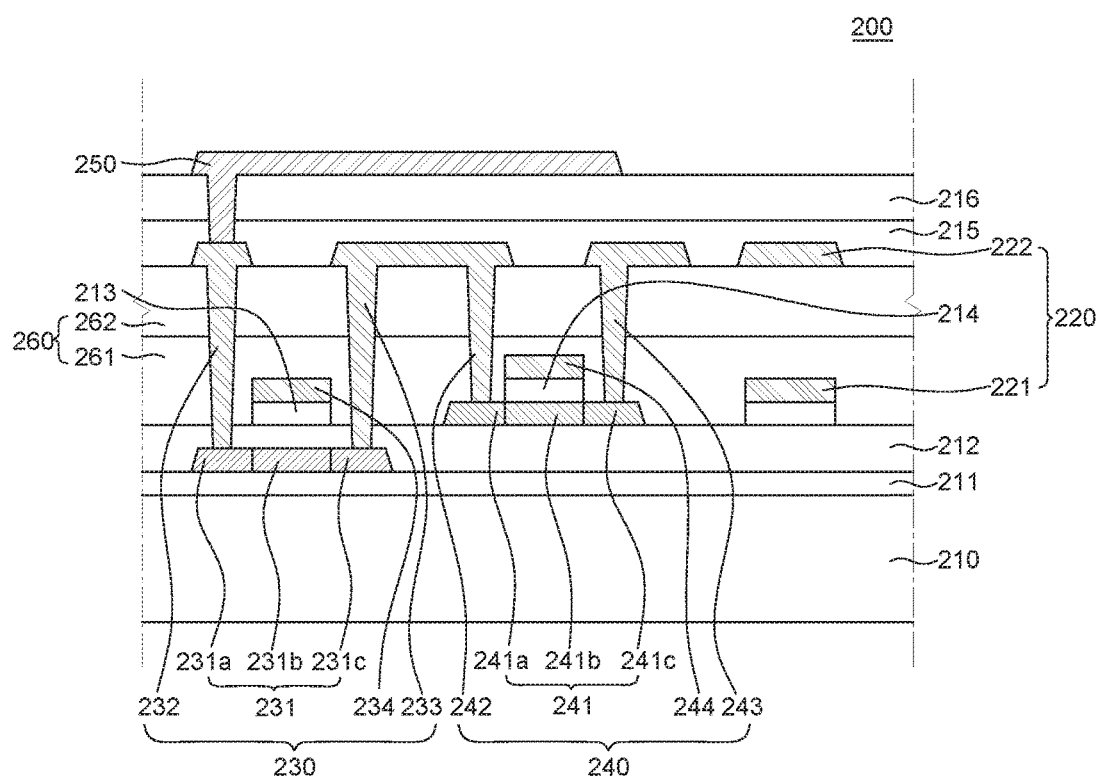
FIG. 2 is a cross-sectional view illustrating an OLED device including multiple types of thin-film transistors according to an exemplary embodiment of the present disclosure.

FIG. 2 is a cross-sectional view illustrating an OLED device including multiple types of thin-film transistors according to an exemplary embodiment of the present disclosure.

Referring to FIG. 2, an OLED device 200 includes a substrate 210, a buffer layer 211, a storage capacitor 220, an LTPS thin-film transistor 230, an oxide semiconductor thin-film transistor 240, a gate insulating layer 212 of the LTPS thin-film transistor 230, an interlayer insulating layer 260, a gate insulating layer 214 of the oxide semiconductor thin-film transistor 240, a passivation layer 215, a planarization layer 216 and an anode 250.

Since the LTPS thin-film transistor 230 has good response characteristics, it can be used as a driving thin-film transistor of a pixel circuit. The LTPS thin-film transistor 230 shown in FIG. 2 is a coplanar thin-film transistor. Since the oxide semiconductor thin-film transistor 240 has good off-current characteristics, it can be used as a switching thin-film transistor of a pixel circuit. The oxide semiconductor thin-film transistor 240 shown in FIG. 2 is a coplanar thin-film transistor.

Hereinafter, elements of the OLED device 200 will be described in detail with reference to FIG. 2.

The substrate 210 supports thereon a variety of elements of the OLED device 200. The substrate 210 may be made of a material such as glass or plastic having flexibility. When the substrate 210 is made of a plastic material, it may be made of, for example, polyimide (PI). When the substrate 210 is made of polyimide (PI), an OLED device may be fabricated with a glass support substrate under the substrate 210, and the support substrate may be separated therefrom after the OLED device is produced. After the support substrate is separated therefrom, a back plate may be disposed under the substrate 210 to support it. The back plate may be made of a material such as glass or plastic having flexibility.

When the substrate 210 is made of a plastic material, the substrate 210 may have a multilayer structure in order to reliably block moisture or hydrogen permeating into the OLED device 200 from below the substrate 210 and to reliably shield the OLED device 2000 from electrical influence from the outside. For example, in order to more reliably block moisture or hydrogen permeating from below the substrate 210, the substrate 210 may have a three-layer structure of a plastic layer, an inorganic film and a plastic layer. The inorganic film may be made of an inorganic material such as silicon nitride (SiNx).

The buffer layer 211 is formed on the entire surface of the substrate 210. The buffer layer 211 may be made up of a single layer of silicon oxide (SiOx) or multiple layers of silicon nitride (SiNx) and silicon oxide (SiOx). The buffer layer 211 enhances the adhesion between the layers formed thereon and the substrate 210, and blocks alkaline components or the like leaking out of the substrate 210. The buffer layer 211 may also serve to supply hydrogen to the LTPS thin-film transistor 230 in a hydrogenation process, which will be described later. It is to be understood that the buffer layer 211 is not an essential element and may be omitted depending on the type and material of the substrate 210, the structure and type of the thin-film transistor, etc.

The LTPS thin-film transistor 230 is disposed on the buffer layer 211. The LTPS thin-film transistor 230 includes a gate electrode 234, a source electrode 232, a drain electrode 233 and an active layer 231 made of polysilicon.

The active layer 231 of the LTPS thin-film transistor 230 is disposed on the buffer layer 211. The active layer 231 of the LTPS thin-film transistor 230 includes a channel region 231b in which a channel is formed when the LTPS thin-film transistor 230 is driven, a source region 231a and a drain region 231c adjacent to the channel region 231b. The channel region 231b, the source region 231a and the drain region 231c are defined by ion doping (impurity doping).

The active layer 231 of the LTPS thin-film transistor 230 contains polysilicon. Specifically, an amorphous silicon (a-Si) material is deposited on the buffer layer 211, a dehydrogenation process and a crystallization process are carried out to form polysilicon, and the polysilicon is patterned to form the active layer 231. In addition, after the interlayer insulating layer 213 of the LPTS thin-film transistor, which will be described later, is formed, an activation process and a hydrogenation process may be further carried out to complete the active layer 231.

The first gate insulating layer 212 of the LTPS thin-film transistor 230 is disposed on the active layer 231 and the buffer layer 211 of the LTPS thin-film transistor 230. The first gate insulating layer 212 of the LTPS thin-film transistor 230 may be made up of a single layer of silicon oxide (SiOx) or multiple layers of silicon nitride (SiNx) or silicon oxide (SiOx). When the first gate insulating layer 212 of the LTPS thin-film transistor 230 is made up of multiple layers, in order to suppress or minimize the active layer 241 of the oxide semiconductor thin-film transistor 240 from being exposed to hydrogen, it is desirable that an inorganic layer with a higher hydrogen content is disposed above an inorganic layer with a lower hydrogen content. For example, a silicon nitride (SiNx) layer may be disposed on the active layer 231 and the buffer layer 211 of the LTPS thin-film transistor 230, and a silicon oxide (SiOx) layer may be disposed on the silicon nitride (SiNx) layer. Thus, the active layer 241 of the oxide semiconductor thin-film transistor 240 is adjacent to the silicon oxide (SiOx) layer having a relatively low hydrogen content, so that it is possible to suppress or minimize the active layer 241 from becoming conductive. When hydrogen is diffused in the active layer 241 of the oxide semiconductor thin-film transistor 240, the active layer 241 of the oxide semiconductor thin-film transistor 240 may be reduced, and the threshold voltage Vth of the oxide semiconductor thin-film transistor 240 may be changed. In the first gate insulating layer 212 of the LTPS thin-film transistor 230, contact holes are formed, via which the source electrode 232 and the drain electrode 233 of the LTPS thin-film transistor 230 are connected to the source region 231a and the drain region 231c of the active layer 231 of the LTPS thin-film transistor 230, respectively.

The gate electrode 234 of the LTPS thin-film transistor 230 is disposed on the first gate insulating layer 212 of the LTPS thin-film transistor 230. A metal layer such as molybdenum (Mo) is formed on the first gate insulating layer 212 of the LTPS thin-film transistor 230, and the metal layer is patterned to form the gate electrode 234 of the LTPS thin-film transistor 230. The gate electrode 234 of the LTPS thin-film transistor 230 overlaps with the channel region 231b of the active layer 231 of the LTPS thin-film transistor 230.

The oxide semiconductor thin-film transistor 240 includes a gate electrode 244, a source electrode 242, a drain electrode 243, and an active layer 241 made of an oxide semiconductor.

The oxide semiconductor thin-film transistor 240 is disposed on the first gate insulating layer 212 with the first gate insulating layer 212 of the LTPS thin-film transistor 230 as a buffer layer. More specifically, the active layer 241 of the oxide semiconductor thin-film transistor 240 is disposed on the first gate insulating layer 212 of the LTPS thin-film transistor 230. The active layer 241 of the oxide semiconductor thin-film transistor 240 includes a channel region 241b in which a channel is formed when the oxide semiconductor thin-film transistor 240 is driven, and a source region 241a and a drain region 241c adjacent to the channel region 241b.

The gate insulating layer 214 of the oxide semiconductor thin-film transistor 240 is disposed on the active layer 241 of the oxide semiconductor thin-film transistor 240. The gate insulating layer 214 of the oxide semiconductor thin-film transistor 240 overlaps with the channel region 241*b* of the active layer 241 of the oxide semiconductor thin-film transistor 240.

A metal layer such as molybdenum (Mo) is formed on the gate insulating layer 214 of the oxide semiconductor thin-film transistor 240, and the metal layer is then patterned to form the gate electrode 244 of the oxide semiconductor thin-film transistor 240. The gate electrode 244 of the oxide semiconductor thin-film transistor 240 and the gate electrode 234 of the LTPS thin-film transistor 230 may be formed together via the same process. That is, after the metal layer is formed on the first gate insulating layer 212 of the LTPS thin-film transistor 230 and the active layer 241 of the oxide semiconductor thin-film transistor 240, the metal layer may be patterned so that the gate electrode 234 of the LTPS thin-film transistor 230 and the gate electrode 244 of the oxide semiconductor thin-film transistor 240 are formed at the same time. By doing so, the gate electrode 234 of the LTPS thin-film transistor 230 and the gate electrode 244 of the oxide semiconductor thin-film transistor 240 may have the same material and the same thickness. As described above, by forming the gate electrode 234 of the LTPS thin-film transistor 230 and the gate electrode 244 of the oxide semiconductor thin-film transistor 240 together via the same process, it is possible to save the processing time and to reduce the number of masks and the processing cost.

As shown in FIG. 2, the plurality of transistors included in the pixels P of the OLED device 200 have the coplanar structure. In addition, in the coplanar transistor shown in FIG. 2, the gate electrode 234 of the LTPS thin-film transistor 230 and the active layer 241 and the gate electrode 244 of the oxide semiconductor thin-film transistor 240 are disposed on the gate insulating layer 212 of the LTPS thin-film transistor 230, such that the structure of the transistor can become simpler. That is, the elements of the oxide semiconductor thin-film transistor 240 are disposed in the same layer as some of the elements of the LTPS thin-film transistor 230. Such structure can shorten the fabrication processing time of the OLED device, and can reduce the number of masks and processing cost.

Between the gate electrode 234 of the LTPS thin-film transistor 230 and the first gate insulating layer 212 of the LTPS thin-film transistor 230, an inorganic layer made of the same material as the gate insulating layer 214 of the oxide semiconductor thin-film transistor 240 may be disposed. The inorganic layer disposed between the first gate insulating layer 212 of the LTPS thin-film transistor 230 and the gate electrode 234 of the LTPS thin-film transistor 230 becomes a second gate insulating layer 213 of the LTPS thin-film transistor 230. The second gate insulating layer 213 may be omitted depending on the fabricating process.

The interlayer insulating layer 260 is disposed on the gate electrode 234 of the LTPS thin-film transistor 230 and the gate electrode 244 of the oxide semiconductor thin-film transistor 240. The interlayer insulating layer 260 may be made up of multiple layers. For example, the interlayer insulating layer 260 may be made up of a first interlayer insulating layer 261 and a second interlayer insulating layer 262 disposed on the first interlayer insulating layer 261. The second interlayer insulating layer 262 may be made of silicon nitride (SiNx). The first interlayer insulating layer 261 may be made of silicon oxide (SiOx) having a hydrogen content lower than the hydrogen content of the second interlayer insulating layer 262. In the interlayer insulating layer 260, contact holes may be formed in order to expose the source region 231*a* and the drain region 231*c* of the active layer 231 of the LTPS thin-film transistor 230 and the source region 241*a* and the drain region 241*c* of the active layer 241 of the oxide semiconductor thin-film transistor 240.

The source electrode 232 and the drain electrode 233 of the LTPS thin-film transistor 230 and the source electrode 242 and the drain electrode 243 of the oxide semiconductor thin-film transistor 240 are disposed on the interlayer insulating layer 260. The source electrode 232 and the drain electrode 233 of the LTPS thin-film transistor 230 and the source electrode 242 and the drain electrode 243 of the oxide semiconductor thin-film transistor 240 may be made of a conductive metal material, and made up of three-layer structure of titanium (Ti)/aluminum (Al)/titanium (Ti), for example.

The source electrode 232 and the drain electrode 233 of the LTPS thin-film transistor 230 are electrically connected to the source region 231*a* and the drain region 231*c* of the active layer 231 of the LTPS thin-film transistor 230 through the contact holes formed in the first gate insulating layer 212 of the LTPS thin-film transistor 230, the first interlayer insulating layer 261 and the second interlayer insulating layer 262, respectively. In addition, the source electrode 242 and the drain electrode 243 of the oxide semiconductor thin-film transistor 240 are connected to the source region 241*a* and the drain region 241*c* of the active layer 241 of the oxide semiconductor thin-film transistor 240 through the contact holes formed in the first interlayer insulating layer 261 and the second interlayer insulating layer 262, respectively.

The source electrode 232 and the drain electrode 233 of the LTPS thin-film transistor 230 and the source electrode 242 and the drain electrode 243 of the oxide semiconductor thin-film transistor 240 may be formed together via the same process (i.e. can be simultaneously formed by the same process). That is, a source/drain material layer may be patterned so that the source electrode 232 and the drain electrode 233 of the LTPS thin-film transistor 230 and the source electrode 242 and the drain electrode 243 of the oxide semiconductor thin-film transistor 240 are formed together. Accordingly, the source electrode 232 and the drain electrode 233 of the LTPS thin-film transistor 230 and the source electrode 242 and the drain electrode 243 of the oxide semiconductor thin-film transistor 240 may have the same thickness and may be made of the same material. As described above, by forming the source electrode 232 and the drain electrode 233 of the LTPS thin-film transistor 230 and the source electrode 242 and the drain electrode 243 of the oxide semiconductor thin-film transistor 240 together via the same process, it is possible to save processing time and to reduce the number of masks and the processing cost.

Although the drain electrode 233 of the LTPS thin-film transistor 230 is connected to the source electrode 242 of the oxide semiconductor thin-film transistor 240 in FIG. 2, in some pixel circuits, the drain electrode 233 of the LTPS thin-film transistor 230 may not be connected to the source electrode 242 of the oxide semiconductor thin-film transistor 240.

The passivation layer 215 is disposed on the source electrode 232 and the drain electrode 233 of the LTPS thin-film transistor 230 and the source electrode 242 and the drain electrode 243 of the oxide semiconductor thin-film transistor 240. The passivation layer 215 is an insulating layer for protecting the LTPS thin-film transistor 230 and the oxide semiconductor thin-film transistor 240. The passivation layer 215 can suppress hydrogen diffusing from the top. When hydrogen is diffused in the active layer 241 of the oxide semiconductor thin-film transistor 240, the active layer 241 of the oxide semiconductor thin-film transistor 240 may be reduced, and the threshold voltage Vth of the oxide semiconductor thin-film transistor 240 may be changed. In addition, the passivation layer 215 suppresses the moisture contained in the planarization layer 216, which will be described later, from permeating into the oxide semiconductor thin-film transistor 240. A contact hole for exposing the source electrode 232 or the drain electrode 233 of the LTPS thin-film transistor 230 is formed in the passivation layer 250. The passivation layer 218 may be made of silicon oxide (SiOx).

The planarization layer 215 is disposed on the passivation layer 216. The planarization layer 216 is an insulating layer for providing a flat surface over the oxide semiconductor thin-film transistor 240 and the LTPS thin-film transistor 230 and may be made of an organic material. The planarization layer 216 may be omitted in some implementations. In FIG. 2, the upper portions of various insulating layers below the planarization layer 216 are all shown as being flat. However, in reality, the upper portions may not be flat but have level differences created by the elements of the oxide semiconductor thin-film transistor 240 and the LTPS thin-film transistor 230 or foreign matters introduced. For this reason, by providing a flat surface over the oxide semiconductor thin-film transistor 240 and the LTPS thin-film transistor 230, an organic light-emitting element 280 can be more reliably formed. A contact hole for exposing the source electrode 232 or the drain electrode 233 of the LTPS thin-film transistor 230 is formed in the planarization layer 216.

The storage capacitor 220 is disposed on the substrate 210. The storage capacitor 220 includes a first electrode 221 disposed on the first gate insulating layer 212 of the LTPS thin-film transistor 230, and a second electrode 222 formed on the interlayer insulating layer 260. The storage capacitor 220 may further include a third electrode disposed on the passivation layer 218, to thereby further increase the capacitance of the storage capacitor. The first electrode 221 of the storage capacitor 220 may be disposed on an inorganic layer made of the same material as the gate insulating layer 214 of the oxide semiconductor thin-film transistor 240. It is to be noted that the above-described inorganic layer may be omitted depending on the process, and the first electrode 221 of the storage capacitor 220 may be disposed on the gate insulating layer 212 of the LTPS thin-film transistor 230 as described above.

The first electrode 221 of the storage capacitor 220 may be formed together with (i.e. at the same time using the same process) and made of the same material as the gate electrode 234 of the LTPS thin-film transistor 230 and the gate electrode 244 of the oxide semiconductor thin-film transistor 240. In addition, the second electrode 222 and the storage capacitor 220 may be formed together with and made of the same material as the source electrode 232 and drain electrode 233 of the LTPS thin-film transistor 230 and the source electrode 242 and the drain electrode 243 of the oxide semiconductor thin-film transistor 240. The third electrode 223 of the storage capacitor 220 may be formed together with and made of the same material as the anode 250. Accordingly, the storage capacitor 220 can be formed during the process of fabricating the oxide semiconductor thin-film transistor 240 and the LTPS thin-film transistor, without requiring any additional process, so that the processing time and the processing cost can be reduced.

The gate electrode 244 and the gate insulating layer 214 of the oxide semiconductor thin-film transistor 240 may be patterned at the same time. In other words, additional mask process can be omitted for forming the gate insulating layer 214 of the oxide semiconductor thin-film transistor 240. As a result, the processing time and the processing cost can be reduced. When the gate electrode 244 and the gate insulating layer 214 of the oxide semiconductor thin-film transistor 240 are patterned at the same time, a second gate insulating layer 213 made of the same material as the gate insulating layer 214 of the oxide semiconductor thin-film transistor 240 may be further disposed. The second gate insulating layer 213 of the LTPS thin-film transistor 230 is patterned at the same time with the gate electrode 234 of the LTPS thin-film transistor 230. In addition, between the first electrode 221 of the storage capacitor 220 and the first gate insulating layer 212 of the LTPS thin-film transistor 230, an inorganic layer made of the same material as the gate insulating layer 214 of the oxide semiconductor thin-film transistor 240 may be disposed. The first electrode 221 of the storage capacitor 220 and the inorganic layers disposed under the first electrode 221 are patterned at the same time.

The organic light-emitting element including the anode 250 is disposed on the planarization layer 216. The organic light-emitting element includes the anode 250 formed on the planarization layer 216 and electrically connected to the source electrode 232 of the LTPS thin-film transistor 230, an organic layer disposed on the anode 250, and a cathode formed on the organic layer. Meanwhile, the anode 250 may be connected to the drain electrode 233 of the LTPS thin-film transistor 230 depending on the pixel circuit of the OLED device 200. The organic layer emits light of a particular color and may include one among of a red organic emission layer, a green organic emission layer, a blue organic emission layer and a white organic emission layer. When the organic layer includes a white organic emission layer, a color filter for converting white light from the white organic emission layer into light of a different color may be disposed on the organic light-emitting element. The organic layer may further include various organic layers such as a hole transport layer, a hole injection layer, an electron injection layer and an electron transport layer, in addition to the organic emission layer.

An encapsulation layer may be disposed on the organic light-emitting element. The encapsulation layer is to protect the organic light-emitting element from exposure to moisture, which is vulnerable to moisture.

The process of forming an oxide semiconductor thin-film transistor after forming all of the LTPS thin-film transistors is very complicated, such that the processing time and cost are increased and thus productivity is low. In this regard, in the OLED device 200 according to an exemplary embodiment of the present disclosure, the LTPS thin-film transistor 230 and the oxide semiconductor thin-film transistor 240 are formed on the same layer so that the structure becomes simpler, to thereby reduce the number of masks required for the processing and to save the processing time and cost. More specifically, by disposing the gate electrode 234 and some elements of the LTPS thin-film transistor 230 and the oxide semiconductor thin-film transistor 240 on the first gate insulating layer 212 of the LTPS thin-film transistor 230, the structure of the OLED device 200 can be simplified.

FIGS. 3A to 3I are cross-sectional views illustrating processing steps of a method of fabricating an OLED device including multiple types of thin-film transistors according to an exemplary embodiment of the present disclosure. The method of FIGS. 3A to 3I preferably can be used to form the OLED device of FIG. 2, but can be used to form other OLED devices.

Figure 3A:
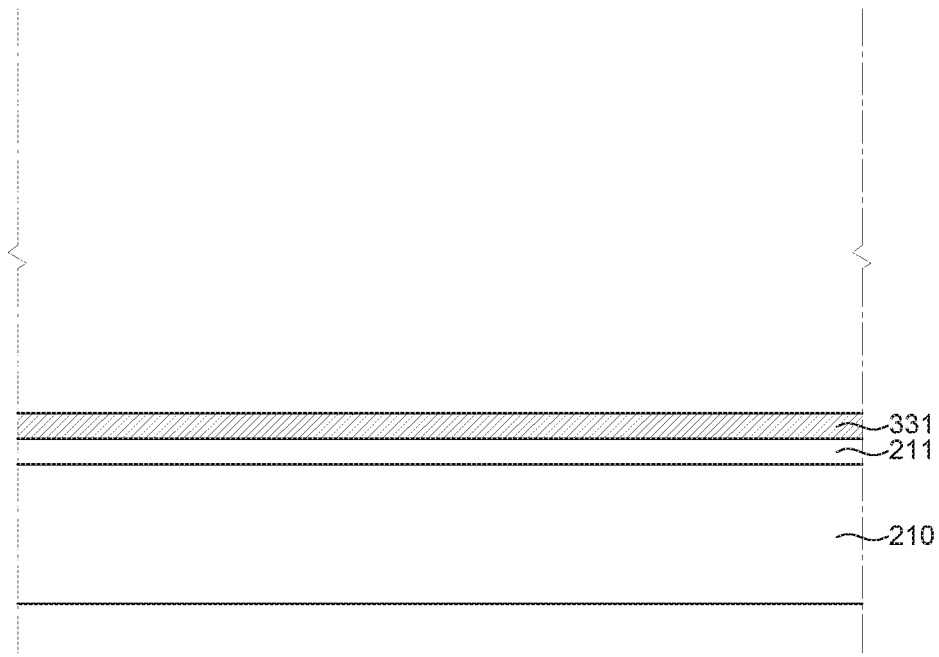
FIGS. 3A to 3I are cross-sectional views illustrating processing steps of a method of fabricating an OLED device including multiple types of thin-film transistors according to an exemplary embodiment of the present disclosure.

Referring to FIG. 3A, a buffer layer 211 is deposited on the surface of a substrate 210. Specifically, the buffer layer 211 of a single layer of silicon oxide (SiOx) may be formed, or the buffer layer 211 of multilayer layers may be formed by alternately stacking silicon nitride (SiNx) and silicon oxide (SiOx).

Referring to FIG. 3A, an amorphous silicon (a-Si) material is deposited on the surface of the buffer layer 211 to form an amorphous silicon layer 331, and a dehydrogenation process is performed on the amorphous silicon layer 331. When there is a lot of hydrogen in the amorphous silicon layer 331, the hydrogen in the amorphous silicon layer 331 may explode in the subsequent crystallization process, resulting in defects. The dehydrogenation process is a step of removing hydrogen from the amorphous silicon layer 331, which is carried out after the amorphous silicon layer 331 is formed and before the crystallization process is performed.

After the dehydrogenation process is completed, the crystallization process is carried out on the amorphous silicon layer 331. The crystallization process is a step of crystallizing amorphous silicon in the amorphous silicon layer 331 and converting it into polysilicon, and may be carried out, for example, by an excimer laser annealing (ELA) process.

Figure 3B:
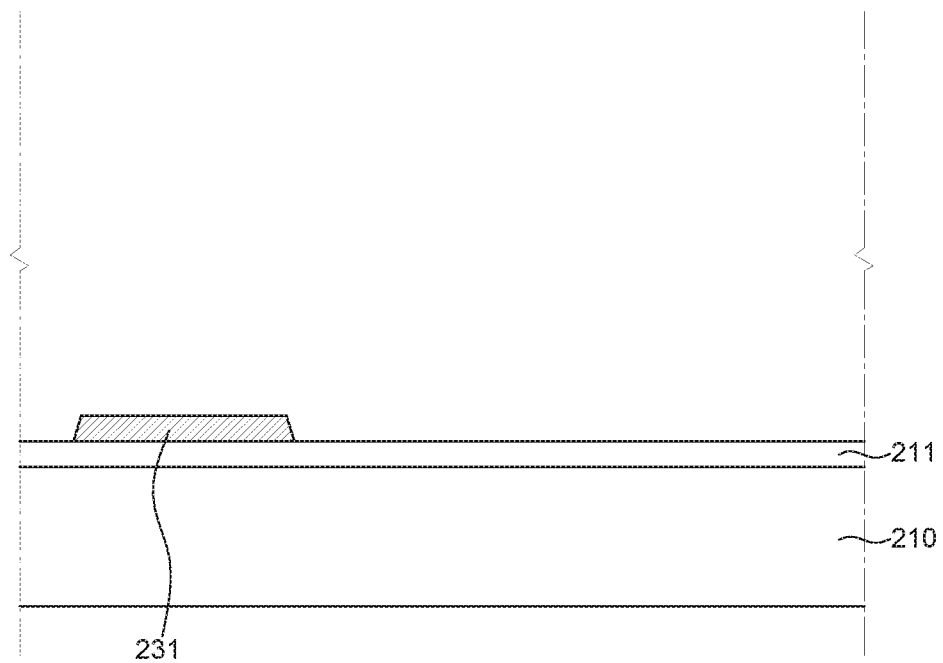

Subsequently, referring to FIG. 3B, the crystallized amorphous a-Si layer 331 is patterned to form an active layer 231 of an LTPS thin-film transistor 230.

Figure 3C:
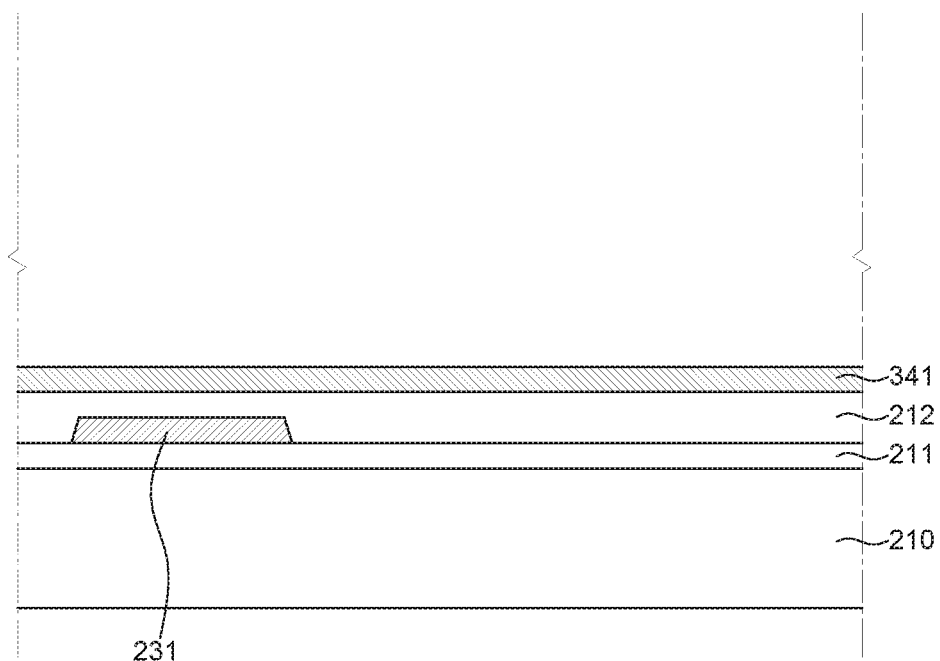

Referring to FIG. 3C, a first gate insulating layer 212 of the LTPS thin-film transistor 230 is formed on the active layer 231 of the LTPS thin-film transistor 230. The first gate insulating layer 212 may be made of silicon oxide (SiOx).

The first gate insulating layer 212 may be formed in an environment of approximately 350° C. or less. In a typical structure in which the second active layer 241 is not in contact with the upper surface of the first gate insulating layer 212, the gate insulating layer is formed in an environment of approximately 420° C. When the first gate insulating layer 212 is deposited in an environment of approximately 420° C., the first gate insulating layer 212 may have relatively high hydrogen content, compared to the gate insulating layer deposited in an environment of approximately 350° C. or less. When the active layer 241 of the oxide semiconductor thin-film transistor 240 is exposed hydrogen, the active layer 241 of the oxide semiconductor thin-film transistor 240 may be reduced, and the threshold voltage Vth of the oxide semiconductor thin-film transistor 240 may be changed. Therefore, it is preferable that the first gate insulating layer 212 adjacent to the active layer 241 of the oxide semiconductor thin-film transistor 240 shown in FIGS. 2 and 3C has low hydrogen content.

Subsequently, an IGZO layer 341 is formed by depositing a metal oxide, for example, indium-gallium-zinc oxide (IGZO) on the gate insulating layer 212 of the LTPS thin-film transistor 230. Although FIG. 3C shows that the IGZO layer 341 is formed on the assumption that the active layer 241 of the oxide semiconductor thin-film transistor 240 is made of IGZO among various metal oxides. However, this is merely illustrative, and other metal oxides may also be used other than IGZO.

Figure 3D:
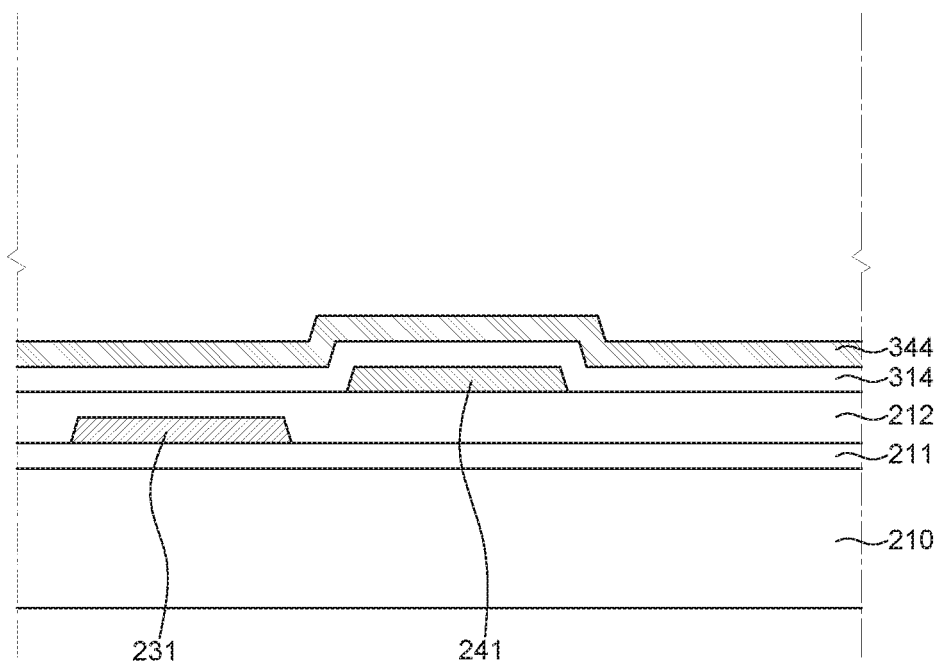

Referring to FIG. 3D, the active layer 241 of the oxide semiconductor thin-film transistor 240 is formed by patterning the IGZO layer 341. Subsequently, heat treatment is carried out on the active layer 241 to stabilize the active layer 241, thereby increasing the reliability of the oxide semiconductor thin-film transistor 240.

Referring to FIG. 3D, silicon oxide (SiOx) is deposited on the active layer 241 of the oxide semiconductor thin-film transistor 240 to form an inorganic layer 314. Subsequently, a material 344 for a gate electrode is deposited on the inorganic layer 314. The material 344 for the gate electrode may be molybdenum (Mo).

Subsequently, referring to FIG. 3E, the material 344 for the gate electrode is patterned to form the gate electrode 234 of the LTPS thin-film transistor 230, the gate electrode 244 of the oxide semiconductor thin-film transistor 240, and the first electrode 211 of the storage capacitor 220. In doing so, when the gate electrode 234 of the LTPS thin-film transistor 230 is patterned, the inorganic layer 314 under the gate electrode 234 of the LTPS thin-film transistor 230 is also patterned, such that a second gate insulating layer 213 of the LTPS thin-film transistor 230 is formed.

Figure 3E:
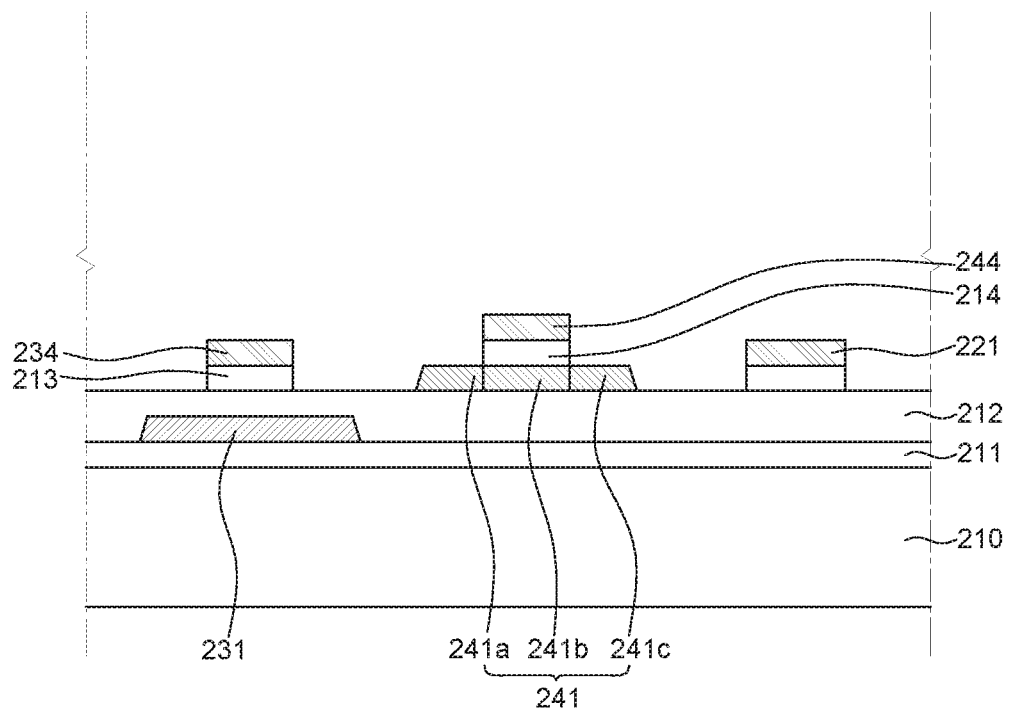

As shown in FIG. 3E, the gate insulating layer of the LTPS thin-film transistor 230 may be made up of multiple layers consisting of the first gate insulating layer 212 and the second gate insulating layer 213. When different masks are used to form the gate insulating layer 214 of the oxide semiconductor thin-film transistor 240 and the gate electrode 234 of the LTPS thin-film transistor 230, the thickness of the second insulating layer 213 of the LTPS thin-film transistor 230 may be different from the thickness of the gate insulating layer 214 of the oxide semiconductor thin-film transistor 240, or the second gate insulating layer 213 of the LTPS thin-film transistor 230 may be omitted. In FIG. 3E, the thickness of the first gate insulating layer 212 may be approximately 50 nm, and the thickness of the second gate insulating layer 213 may be approximately 100 nm. However, this is merely illustrative. The thicknesses of the first gate insulating layer 212 and the second gate insulating layer 213 may vary depending on processing conditions such as pressure and temperature. It is to be noted that the thicknesses of the first gate insulating layer 212 and the second gate insulating layer 213 have to be determined so that they can function as the gate insulating layers of the LTPS thin-film transistor 230. That is, the sum of the thickness of the first gate insulating layer 212 and the second gate insulating layer 213 may have a predetermined value so that the first gate insulating layer 212 and the second gate insulating layer 213 function together as the gate insulating layer of the LTPS thin-film transistor. Therefore, the thickness of the first gate insulating layer 212 may be determined by the thickness of the second gate insulating layer 213.

The gate electrode 244 and the gate insulating layer 214 of the oxide semiconductor thin-film transistor 240 are formed by a dry etching process. By performing the dry etching process, the exposed portion of the active layer 241 of the oxide semiconductor thin-film transistor 240 becomes conductive, such that a source region 241a and a drain region 241c are defined.

Figure 3F:
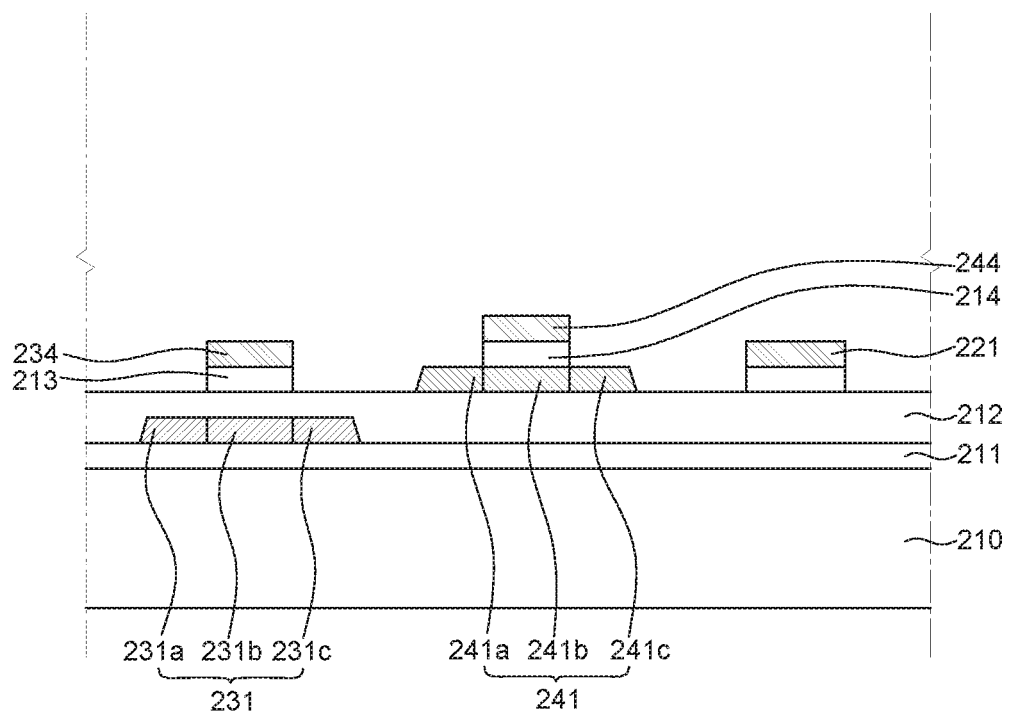

Referring to FIG. 3F, a doping process for implanting impurities into the active layer 231 of the LTPS thin-film transistor 230 disposed under the gate electrode 234 of the LTPS thin-film transistor 230 is carrier by using the gate electrode 234 of the LTPS thin-film transistor 230 as a mask, such that the source region 231a and the drain region 231c of the active layer 231 of the LTPS transistor 230 may be defined. The LTPS thin-film transistor 230 may be formed as one of a PMOS thin-film transistor, an NMOS thin-film transistor and a CMOS thin-film transistor. The method of implanting impurities may vary depending on the type of the transistor. Particularly, when the LTPS thin-film transistor 230 is formed with an NMOS thin-film transistor, in order to suppress the leakage current, the impurity doping concentration is locally reduced at the boundary of the gate electrode 234 on the active layer 241, to suppress an electric field from becoming too large. More specifically, a photoresist larger than the gate electrode 234 of the LTPS thin-film transistor 230 is used to define a heavily doped region. Then, the photoresist is removed and a lightly doped drain (LDD) may be defined by using the gate electrode 234 of the LTPS thin film transistor 230 as a mask.

Figure 3G:
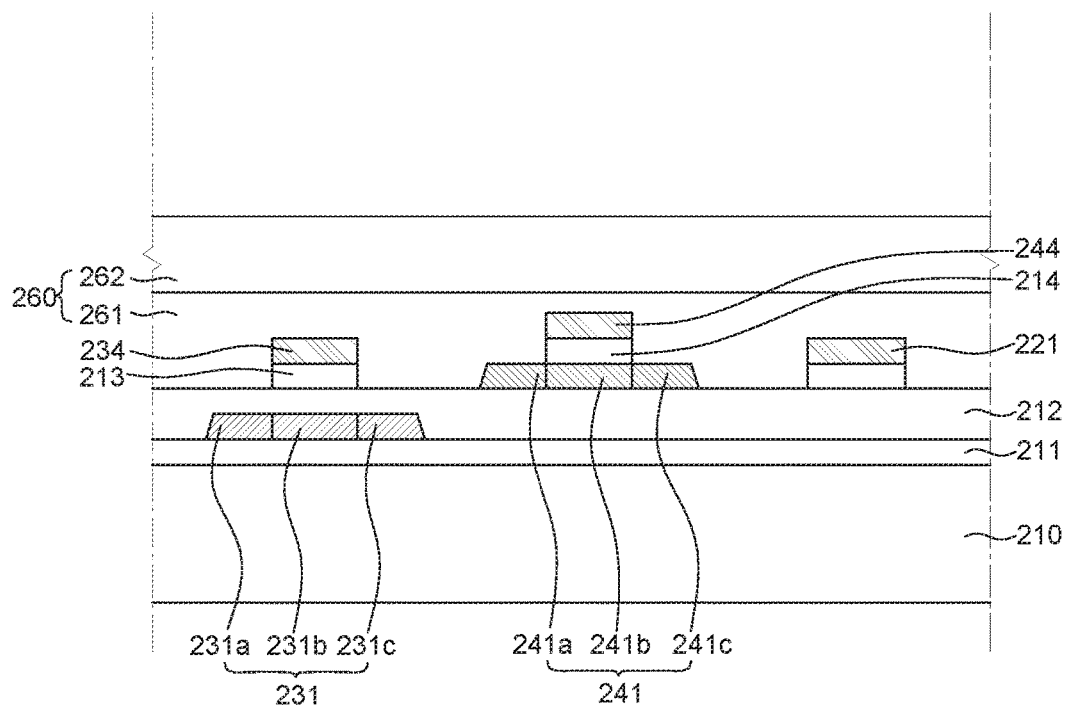

Referring to FIG. 3G, an interlayer insulating layer 260 is formed over the gate electrode 234 of the LTPS thin-film transistor 230, the gate electrode 244 of the oxide semiconductor thin-film transistor 240, the active layer 241 of the oxide semiconductor thin-film transistor 240, the first electrode 221 of the storage capacitor 220 and the first gate insulating layer 212 of the LTPS thin-film transistor 230.

The interlayer insulating layer 260 may be made up of multiple layers consisting of a first interlayer insulating layer 261 made of silicon oxide (SiOx) and a second interlayer insulating layer 262 made of silicon nitride (SiNx). In order to suppress the active layer 231 of the oxide semiconductor thin-film transistor 240 from being exposed to hydrogen during the hydrogenation process of the active layer 231 of the LTPS thin-film transistor 230 to be described later, the second interlayer insulating layer 262 made of silicon nitride (SiNx) is preferably formed on the first interlayer insulating layer 261 made of silicon oxide (SiOx). Since the silicon oxide (SiOx) has a lower hydrogen content than silicon nitride (SiNx), it is desirable that the interlayer insulating layer directly in contact with the active layer 241 of the oxide semiconductor thin-film transistor 240 is made of silicon oxide (SiOx).

After the insulating layer 260 is formed, an activation process and a hydrogenation process are carried out on the active layer 231 of the LTPS thin-film transistor 230.

As a result of the doping process for the active layer 231 of the LTPS thin-film transistor 230, the implanted impurities may be randomly present. In this regard, the activation process is carried out on the active layer 231 of the LTPS thin-film transistor 230 in order to place the above-described impurities in silicon (Si) lattice. In addition, since the doping process for the active layer 231 of the LTPS thin-film transistor 230 is a step for artificially implanting the impurities into the active layer, the silicon (Si) may be damaged as a result of the doping process for the active layer 231 of the LTPS thin-film transistor. In this regard, by performing the activation process on the active layer 231 of the LTPS thin-film transistor 230, the damaged silicon (Si) may be cured.

When there are vacancies in the polysilicon, its properties are degraded. In this regard, by performing the hydrogenation process on the active layer 231 of the LTPS thin-film transistor 230, the vacancies in the polysilicon can be filled with hydrogen. The hydrogenation process for the active layer 231 of the LTPS thin-film transistor 230 is performed by diffusing hydrogen contained in the second interlayer insulating layer 262 via a heat treatment process. When the heat treatment process is carried out under a high temperature, the active layer 241 of the oxide semiconductor thin-film transistor 240 may become conductive. Therefore, the above-described heat treatment process may be performed at approximately 250° C. By performing the hydrogenation process on the active layer 231 of the LTPS thin-film transistor 230, the active layer 231 of the LTPS thin-film transistor 230 can be stabilized.

Before the hydrogenation process of the active layer 231 of the LTPS thin-film transistor 230 is carried out, a hydrogen plasma pre-treatment process may be carried out. The hydrogen plasma pre-treatment process is a preliminary step for supplying hydrogen to the polysilicon layer of the LTPS thin-film transistor 230 prior to the hydrogenation process so that the vacancies of the polysilicon can be more stably filled with hydrogen. The hydrogen plasma pre-treatment process may be performed immediately after the active layer 231 of the LTPS thin-film transistor 230 is formed and may be performed immediately after the first interlayer insulating layer 261 is formed.

Figure 3H:
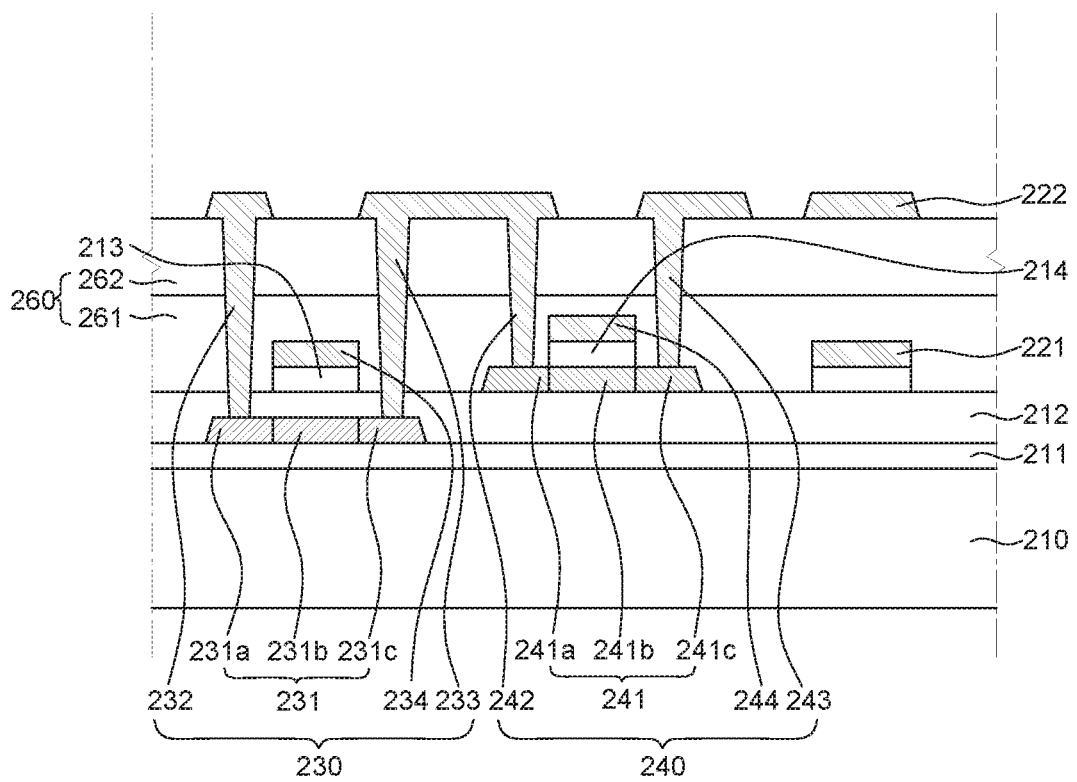

Subsequently, referring to FIG. 3H, contact holes are formed in the gate insulating layer 212 and the interlayer insulating layer 260 of the LTPS thin-film transistor 230, and the source electrode 232 and the drain electrode 233 of the LTPS thin-film transistor 230, and the source electrode 242 and the drain electrode 243 of the oxide semiconductor thin-film transistor 240 are formed. The source electrode 232 and the drain electrode 233 of the LTPS thin-film transistor 230 are connected to the source region 231a and the drain region 231c of the active layer 231 of the LTPS thin-film transistor 230, respectively. The source electrode 242 and the drain electrode 243 of the oxide semiconductor thin-film transistor 240 are connected to the source region 241a and the drain region 241c of the active layer 241 of the oxide semiconductor thin-film transistor 240, respectively.

After the contact holes are formed in the gate insulating layer 212 and the interlayer insulating layer 260 of the LTPS thin-film transistor 230, material for the source electrode and the drain electrode is deposited and patterned on the interlayer insulating layer 260, such that the source electrode 232 and the drain electrode 233 of the LTPS thin-film transistor 230 and the source electrode 242 and the drain electrode 243 of the oxide semiconductor thin-film transistor 240 may be formed. The source electrode 232 and the drain electrode 233 of the LTPS thin-film transistor 230 and the source electrode 242 and the drain electrode 243 of the oxide semiconductor thin-film transistor 240 may be made up of three-layer structure of titanium (Ti)/aluminum (Al)/Titanium (Ti), and the patterning process may be carried out by dry etching.

Figure 3I:
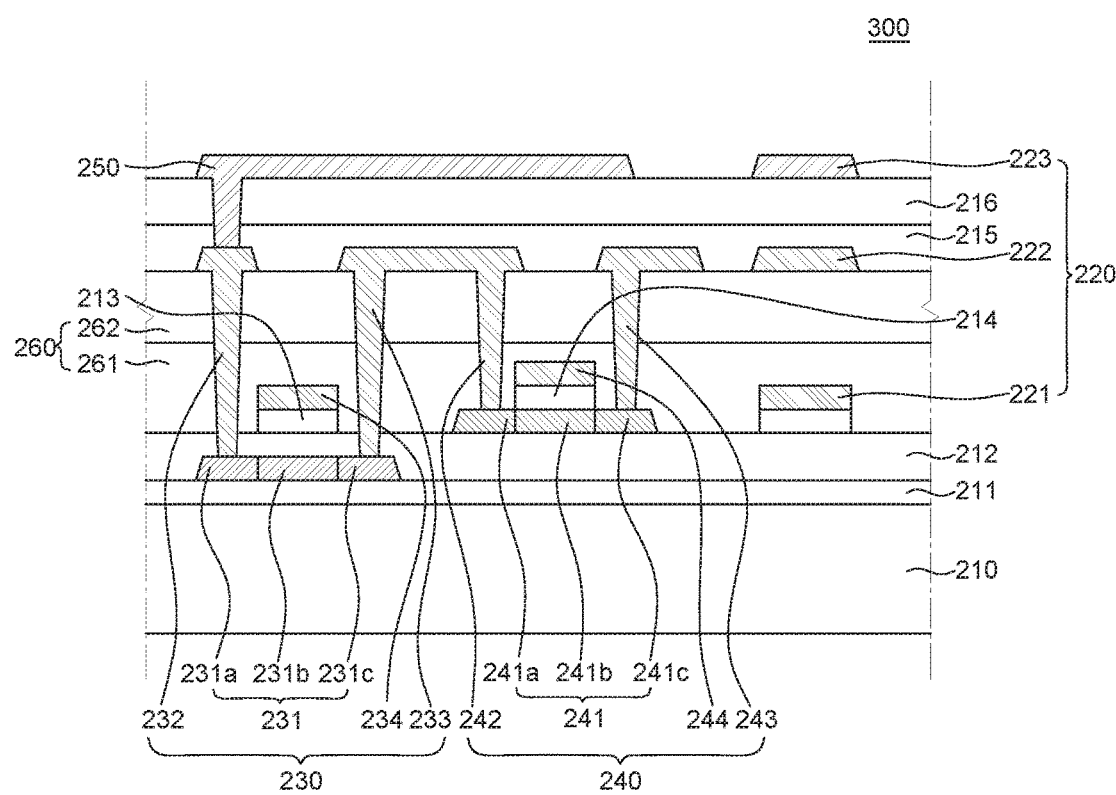

Subsequently, referring to FIG. 3I, a passivation layer 215 is formed so that it covers the source electrode 232 and the drain electrode 233 of the LTPS thin-film transistor 230 and the source electrode 242 and the drain electrode 243 of the oxide semiconductor thin-film transistor 240.

Subsequently, a planarization layer 216 is formed on the passivation layer 215. The planarization layer 216 is an insulating layer for providing a flat surface over the oxide semiconductor thin-film transistor 240 and the LTPS thin-film transistor 230 and may be made of an organic material. In FIGS. 2 and 3A to 3I, the upper portions of various insulating layers below the planarization layer 216 are all shown as being flat. However, in reality, there may be level differences created by the elements of the oxide semiconductor thin-film transistor 240 and the LTPS thin-film transistor 230 or foreign matters. For this reason, by providing a flat surface over the oxide semiconductor thin-film transistor 240 and the LTPS thin-film transistor 230, an organic light-emitting element 280 can be formed more reliably. A contact hole for exposing the source electrode 232 of the LTPS thin-film transistor 230 is formed in the passivation layer 215 and the planarization layer 216.

After the contact hole is formed in the passivation layer 215 and the planarization layer 216, an anode 250, an organic light-emitting element, a cathode and an encapsulation layer are further formed on the passivation layer 215.

Figure 4:
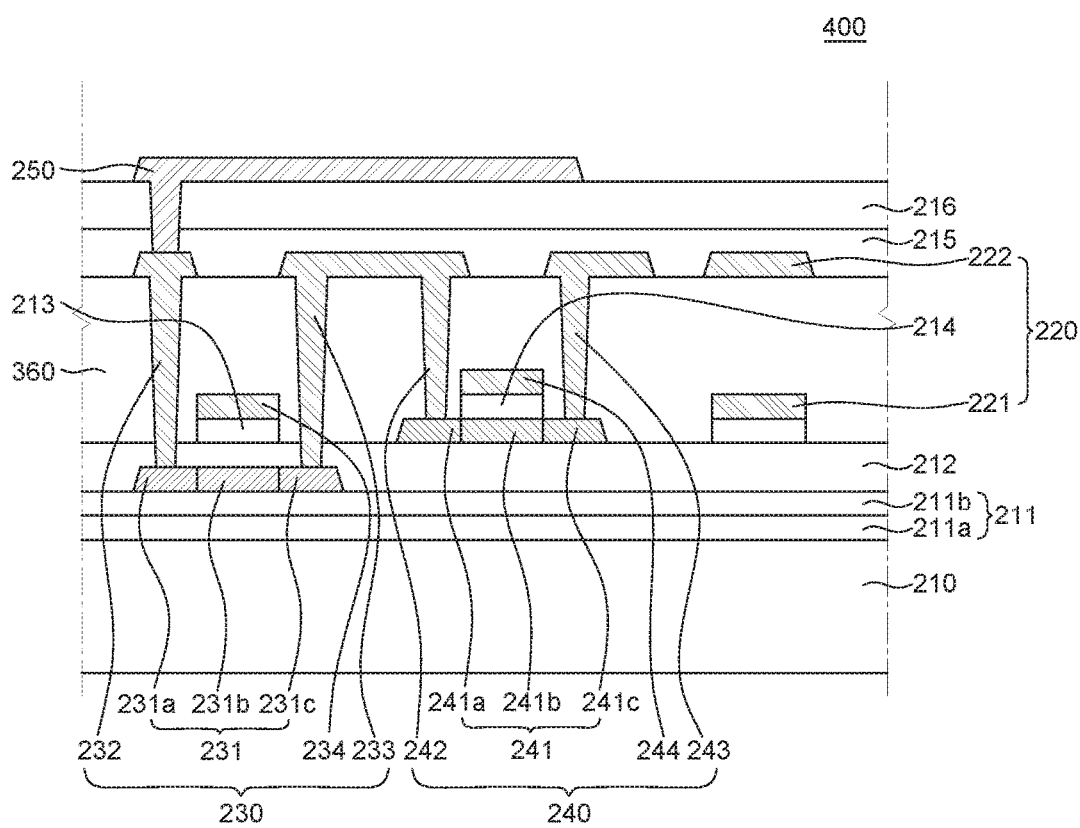
FIG. 4 is a cross-sectional view illustrating an OLED device including multiple types of thin-film transistors according to an exemplary embodiment of the present disclosure.

FIG. 4 is a cross-sectional view illustrating an OLED device including multiple types of thin-film transistors according to an exemplary embodiment of the present disclosure.

The OLED device 400 shown in FIG. 4 is substantially identical to the OLED device 200 shown in FIG. 2 except that the buffer layer 211 and the interlayer insulating layer 360 are modified; and, therefore, the duplicate description is omitted or may be brief.

The buffer layer 211 may be made up of multiple layers. Referring to FIG. 4, a first buffer layer 211a having a relatively high hydrogen content may be disposed on a substrate 210, and a second buffer layer 211b having a relatively low hydrogen content than the first buffer layer 211a may be disposed on the first buffer layer 211a. The first buffer layer 211a may be made of silicon nitride (SiNx), and the second buffer layer 211b may be made of silicon oxide (SiOx).

After the interlayer insulating layer 360 is formed, an activation process and a hydrogenation process may be carried out on the active layer 231 of the LTPS thin-film transistor 230. During the hydrogenation process, the hydrogen contained in the first buffer layer 211a is diffused into the active layer 231 of the LTPS thin-film transistor 230, so that the active layer 231 of the LTPS thin-film transistor 230 can be stabilized.

In addition, the activation process and the hydrogenation process for the active layer 231 of the LTPS thin-film transistor 230 may be performed after the gate insulating layer 212 of the LTPS thin-film transistor 230 is formed. Specifically, the activation process and the hydrogenation process may be performed before the active layer 241 of the oxide semiconductor thin-film transistor 240 is formed. Since the active layer 241 of the oxide semiconductor thin-film transistor 240 is formed after the hydrogenation process is completed, the reliability of the oxide semiconductor thin-film transistor 240 can be further improved.

When the buffer layer 211 is made up of multiple layers, the interlayer insulating layer 360 shown in FIG. 4 may be a single layer made of silicon oxide (SiOx). However, the present invention is not limited thereto. Each of the buffer layer 211 and the interlayer insulating layer may be made up of multiple layers.

The exemplary embodiments of the present disclosure can also be described as follows:

According to an aspect of the present disclosure, an OLED device includes a low-temperature poly-silicon (LTPS) thin-film transistor having a first channel layer, a first gate electrode, a first source electrode and a first drain electrode; an oxide semiconductor thin-film transistor having a second channel layer, a second gate electrode, a second source electrode and a second drain electrode; and a functional layer is between the first channel layer and the first gate electrode. The second channel layer is in contact with an upper surface of the functional layer.

The hydrogen content of the functional layer may is lower in contrast to a structure in which the second channel layer is not in contact with the upper surface of the function layer.

The first gate electrode may be on the functional layer, the second gate electrode may be on the second channel layer, and the first gate electrode and the second gate electrode may be made of the same material.

The OLED device further includes a first gate insulating layer is between the second gate electrode and the second channel layer; and a second gate insulating layer is between the functional layer and the first gate electrode. The first gate insulating layer and the second gate insulating layer may be made of the same material.

The functional layer, together with the second gate insulating layer, may function as a gate insulating layer of the LTPS thin-film transistor, and the thickness of the functional layer may be determined by the thickness of the second gate insulating layer.

The OLED device may further include an interlayer insulating layer on the functional layer, and the interlayer insulating layer may cover both the first gate electrode and the second gate electrode The interlayer insulating layer may have a double insulation function, which insulate the first gate electrode of LTPS thin-film transistor from the first source electrode and the first drain electrode and insulate the second source electrode of the oxide semiconductor thin-film transistor from the second source electrode and the second drain electrode at the same time.

The interlayer insulating layer may include a first interlayer insulating layer on the first gate insulating layer and a second interlayer insulating layer on the first interlayer insulating layer.

The hydrogen content of the first interlayer insulating layer may be lower than the hydrogen content of the second interlayer insulating layer.

The first source electrode, the first drain electrode, the second source electrode and the second drain electrode may be on the interlayer insulating layer, and the first source electrode, the first drain electrode, the second source electrode and the second drain electrode may be made of the same material and have the same thickness.

According to an another aspect of the present disclosure, a method of fabricating an OLED device includes forming a first active layer of an LTPS thin-film transistor on a substrate; forming a first gate insulating layer of the LTPS thin-film transistor on the first active layer; forming a second active layer of an oxide semiconductor thin-film transistor on the first gate insulating layer; and forming a first gate electrode of the LTPS thin-film transistor and a second gate electrode of the oxide semiconductor thin-film transistor on the first gate insulating layer and the second active layer, respectively. The second active layer is adjacent to an upper surface of the first gate insulating layer.

The first gate insulating layer may be formed at a temperature of 350° C. or less to suppress the second active layer from becoming conductive.

The method may further include forming the second gate insulating layer of the oxide semiconductor thin-film transistor and the third gate insulating layer of the LTPS thin-film transistor at the same time, between the forming the second active layer and the forming the first gate electrode and the second gate electrode.

The method may further include forming an interlayer insulating layer on the first gate insulating layer, and the interlayer insulating layer may completely cover the first gate electrode, the second gate electrode and the second active layer.

The forming the interlayer insulating layer may include forming a first interlayer insulating layer so that it covers all of the first gate electrode, the second gate electrode and the second active layer; and forming a second interlayer insulating layer on the first interlayer insulating layer.

The hydrogen content of the first interlayer insulating layer may be lower than the hydrogen content of the second interlayer insulating layer.

The method may further include forming a first source electrode and a first drain electrode of the LTPS thin-film transistor and a second source electrode and a second drain electrode of the oxide semiconductor thin-film transistor on the interlayer insulating layer.

The first source electrode and the first drain electrode may be electrically connected to the first active layer, and the second source electrode and the second drain electrode may be electrically connected to the second active layer, respectively, through a plurality of contact holes formed in the interlayer insulating layer.

The method may further include performing a hydrogenation process on the first active layer, between the forming the interlayer insulating layer and the forming the first source electrode, the first drain electrode, the second source electrode and the second drain electrode.

The method may further include forming multiple buffer layers on the substrate in multiple layers before the forming the first active layer.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure can be defined by the appended claims and all equivalents thereof are construed to be within the true scope of the present disclosure.

What is claimed is:

1. An organic light-emitting display (OLED) device comprising:
   a low-temperature poly-silicon (LTPS) thin-film transistor having a first channel layer, a first gate electrode, a first source electrode and a first drain electrode;
   an oxide semiconductor thin-film transistor having a second channel layer, a second gate electrode, a second source electrode and a second drain electrode; and
   a functional layer between the first channel layer and the first gate electrode,
   wherein the second channel layer is in contact with an upper surface of the functional layer.

2. The OLED device of claim 1, wherein the first gate electrode is on the functional layer,
   the second gate electrode is on the second channel layer, and
   the first gate electrode and the second gate electrode are made of the same material.

3. The OLED device of claim 2, further comprising:
   a first gate insulating layer between the second gate electrode and the second channel layer; and
   a second gate insulating layer between the functional layer and the first gate electrode,
   wherein the first gate insulating layer and the second gate insulating layer are made of the same material.

4. The OLED device of claim 3, wherein the functional layer, together with the second gate insulating layer, functions as a gate insulating layer of the LTPS thin-film transistor, and
   wherein a thickness of the functional layer is determined based on a thickness of the second gate insulating layer.

5. The OLED device of claim 1, further comprising:
   an interlayer insulating layer on the functional layer,
   wherein the interlayer insulating layer covers both the first gate electrode and the second gate electrode.

6. The OLED device of claim 5, wherein the interlayer insulating layer has a double insulation function, which insulates the first gate electrode of the LTPS thin-film transistor from the first source electrode and the first drain electrode and insulates the second gate electrode of the oxide semiconductor thin-film transistor from the second source electrode and the second drain electrode at the same time.

7. The OLED device of claim 5, wherein the interlayer insulating layer includes:
   a first interlayer insulating layer on the first gate electrode and the second gate electrode, and
   a second interlayer insulating layer on the first interlayer insulating layer.

8. The OLED device of claim 7, wherein a hydrogen content of the first interlayer insulating layer is lower than a hydrogen content of the second interlayer insulating layer.

9. The OLED device of claim 5, wherein the first source electrode, the first drain electrode, the second source electrode and the second drain electrode are on the interlayer insulating layer, and
   wherein the first source electrode, the first drain electrode, the second source electrode and the second drain electrode are made of a same material and have a same thickness.

* * * * *